United States Patent
Eken

(10) Patent No.: US 11,018,637 B2
(45) Date of Patent: May 25, 2021

(54) HIGH DYNAMIC RANGE TRANSIMPEDANCE AMPLIFIER

(71) Applicant: Analog Devices Global Unlimited Company, Hamilton (BM)

(72) Inventor: Yalcin Alper Eken, Istanbul (FR)

(73) Assignee: ANALOG DEVICES GLOBAL UNLIMITED COMPANY, Hamilton (BM)

(*) Notice: Subject to any disclaimer, the term of this patent is extended or adjusted under 35 U.S.C. 154(b) by 540 days.

(21) Appl. No.: 15/977,739

(22) Filed: May 11, 2018

(65) Prior Publication Data

US 2019/0253030 A1 Aug. 15, 2019

Related U.S. Application Data

(60) Provisional application No. 62/630,711, filed on Feb. 14, 2018.

(51) Int. Cl.
*H03G 1/00* (2006.01)
*G01S 17/89* (2020.01)
*H03F 3/08* (2006.01)
*H03F 3/21* (2006.01)
*H03F 1/08* (2006.01)

(52) U.S. Cl.
CPC .......... *H03F 3/087* (2013.01); *H03F 1/083* (2013.01); *H03F 3/211* (2013.01); *H03G 1/0082* (2013.01); *H03F 2200/456* (2013.01); *H03F 2200/66* (2013.01)

(58) Field of Classification Search
CPC .... H03G 1/0082; H03G 3/3084; G01S 17/89; G01S 7/4861; H03F 3/087; H03F 3/211; H03F 1/083; H03F 2200/66; H03F 2200/456

USPC ........................................................ 356/4.01
See application file for complete search history.

(56) References Cited

U.S. PATENT DOCUMENTS

| | | |
|---|---|---|
| 5,123,732 A | 6/1992 | Gross et al. |
| 5,410,282 A | 4/1995 | Larrick et al. |
| 5,532,471 A | 7/1996 | Khorramabadi et al. |
| 6,404,281 B1 | 6/2002 | Kobayashi |
| 7,183,859 B2 | 2/2007 | Visocchi et al. |
| 9,325,426 B2 | 4/2016 | Swoboda |
| 9,450,542 B2 | 9/2016 | Mita et al. |
| 9,954,622 B2 | 4/2018 | Sugimoto et al. |
| 2007/0152136 A1 | 7/2007 | Yao et al. |
| 2009/0135714 A1 | 5/2009 | Deliwala |
| 2010/0283542 A1 | 11/2010 | Shivaram et al. |

(Continued)

OTHER PUBLICATIONS

Mikko Hintikka et al., A CMOS Laser Radar Receiver for Sub-ns Optical Pulses, 978-1-4799-8229-5/151© 2015 IEEE, 4 pages.

(Continued)

*Primary Examiner* — Daniel L Murphy
(74) *Attorney, Agent, or Firm* — Patent Capital Group

(57) ABSTRACT

Aspects of this disclosure relate to a receiver for a light detection and ranging system. The receiver includes a transimpedance amplifier that is operable in a linear mode for a range of power of light received by the receiver. The receiver can provide information about amplitude of the light outside of the range of power of the light for which the transimpedance amplifier operates in the linear mode. This information can be useful, for example, in identifying an object from which light received by the receiver was reflected.

20 Claims, 8 Drawing Sheets

(56) References Cited

U.S. PATENT DOCUMENTS

2014/0001341 A1    1/2014    Hassibi et al.

OTHER PUBLICATIONS

Sami Kurtti et al., *CMOS Receiver for a Pulsed TOF Laser Rangefinder Utilizing the Time Domain Walk Compensation Scheme*, 20th IMEKO TC4 International Symposium and 18th International Workshop on ADC Modelling and Testing Research on Electric and Electronic Measurement for the Electronic Upturn, Benevento, Italy, Sep. 15-17, 2014, 5 pages.

Thakur et al., *Efficient Design of 64:1 Hybridized MUX for Low Area and Power VLSI*, Int. Journal of Electrical & Electronics Engg., vol. 2, Issue 1 (2015), e-ISSN: 1694-2310 / p-ISSN: 1694-2426, 3 pages.

*MAX3806, Receiver for Optical Distance Measurement*, Maxim Integrated, Rev. 1; Jun. 2014, 10 pages.

*Matrix APD Detector Arrays for LIDAR*, Silicon Sensor International AG, Pacific Silicon Sensor, Inc., press release dated Nov. 9, 2010, 2 pages.

Heinrichs et al., *Three-Dimensional Laser Radar with APD Arrays*, Proceedings vol. 4377, Laser Radar Technology and Applications VI; Sep. 19, 2001, 12 pages.

*Choosing the Correct Switch, Multiplexer, or Protection Product for Your Application*, © 2011 Analog Devices, Inc. www.analog.com/switch-mux, 8 pages.

Robinson et al., *64×64-Element Photocurrent Multiplexer for Infrared Staring Array Application*, IEEE Journal of Solid-State Circuits, vol. SC-22, No. 3, Jun. 1987, 0018-9200/87/0600-0453© 1987 IEEE, 5 pages.

*First Sensor Application Note; APD Array with Guard Ring*, First Sensor, First Sensor AG, Pacific First Sensor, Inc., Ver. 08-07-11, 2 pages.

*ADS7952 Input Multiplexer / Photodiode / Transimpendanceamplifier*, Mar. 2, 2018, http://e2e.ti.com/support/data_converters/precision_data_converters/f/73/t/74981, 6 pages.

*Avalanche Photodiodes for LIDAR Applications*, First Sensor, Mar. 3, 2014, First Sensor, First Sensor AG, First Sensor, Inc., 2 pages.

*High-Speed, Low-Power, Single-Supply Multichannel, Video Multiplexer-Amplifiers*, Maxim, MAX4310-MAX4315, 19-1379; Rev. 3; Mar. 2008, 18 pages.

*11.3 Gbps Optical Receiver*, ADN3010-11 Data Sheet, Analog Devices, © 2015-2016 Analog Devices, Inc., 11 pages.

Kurtti, et al., "An Integrated Receiver Channel for a Laser Scanner", IEEE Instrumentation and Measurement Technology Conference, May 2012.

HIGH DYNAMIC RANGE TRANSIMPEDANCE AMPLIFIER

CROSS-REFERENCE TO RELATED APPLICATION

This application claims the benefit of priority under 35 U.S.C. § 119(e) of U.S. Provisional Patent Application No. 62/630,711, filed Feb. 14, 2018, titled "HIGH DYNAMIC RANGE TRANSIMEPEDANCE AMPLIFIER," the disclosure of which is hereby incorporated by reference in its entirety.

FIELD OF DISCLOSURE

The described technology generally relates to electronics and, more specifically, to transimpedance amplifiers.

BACKGROUND

Light detection and ranging systems are used in variety of situations. For example, light detection and ranging systems can be used with airplanes, automobiles, binoculars or monoculars, etc. to detect a distance between a system and an object. Light detection and ranging systems can transmit and/or receive laser light. A light detection and ranging system can include a receiver that includes a photodiode and a transimpedance amplifier.

SUMMARY OF THE DISCLOSURE

This disclosure describes, among other things, embodiments of receivers, circuits, and methods for light detection and ranging systems. Embodiments of this disclosure relate to providing information about amplitude of light outside of a range of power of the light for which a transimpedance amplifier of a receiver operates in the linear mode. This information can be useful, for example, in identifying an object from which light received by the receiver was reflected.

One aspect of this disclosure is a receiver for a light detection and ranging system with high dynamic range. The receiver comprises an optoelectrical device, a transimpedance amplifier, and an over-current sensing circuit coupled to the transimpedance amplifier. The optoelectrical device is configured to receive light and to convert the light to a current. The transimpedance amplifier is configured to generate an output voltage from the current. The transimpedance amplifier is operable in a linear mode for a range of power of the light. The over current sensing circuit is configured to generate an overload signal indicative of an amplitude of the light outside of the range of power of the light for which the transimpedance amplifier is operable in the linear mode.

The over-current sensing circuit can be configured to clip an input voltage of the transimpedance amplifier, sense a clipping current associated with clipping the input voltage to the transimpedance amplifier, and generate the overload signal based on the clipping current. The overload signal can be an overload voltage, and the over current sensing circuit can include a voltage conversion circuit configured to generate the overload voltage based on the clipping current.

The over-current sensing circuit can include a clipping circuit configured to clip an input voltage of the transimpedance amplifier and provide a clipping current, and a current scaling circuit configured to scale the clipping current to generate a scaled clipping current, wherein the over-current sensing circuit is configured to generate the overload signal based on the scaled clipping current.

The over-current sensing circuit can include a clipping bipolar transistor having a base configured to receive a clipping voltage and an emitter electrically connected to an input of the transimpedance amplifier, wherein the clipping voltage sets a level at which the clipping bipolar transistor clips the input voltage of the transimpedance amplifier.

The receiver can include a combining circuit configured to combine the output voltage generated by the transimpedance amplifier and overload signal, wherein the overload signal is an overload voltage.

Another aspect of this disclosure is a current pulse processing circuit with high dynamic range. The current pulse processing circuit comprises a transimpedance amplifier and an over-current sensing circuit coupled to the transimpedance amplifier. The transimpedance amplifier is configured to generate a voltage pulse from a current pulse. The transimpedance amplifier is operable in a linear mode for a range of current. The over-current sensing circuit is configured to generate an overload signal indicative of an amplitude of the current pulse outside of the range of current for which the transimpedance amplifier is operable in the linear mode.

The over-current sensing circuit can sense a clipping current associated with clipping an input voltage to the transimpedance amplifier and generate the overload signal based on the clipping current.

The over-current sensing circuit can include a clipping circuit configured to clip an input voltage of the transimpedance amplifier and provide a clipping current and a voltage conversion circuit configured to generate the overload signal based on the clipping current, wherein the overload signal is a voltage signal. The over-current sensing circuit can include a current scaling circuit configured to scale the clipping current to generate a scaled clipping current, wherein the overload signal is based on the scaled clipping current. The voltage conversion circuit can be configured such that the overload signal has a logarithmic relationship with the amplitude of the current pulse out of the range of current for which the transimpedance amplifier is configured to operate in the linear mode. The voltage conversion circuit can be configured such that the overload signal has a linear relationship with the amplitude of the current pulse out of the range of current for which the transimpedance amplifier is configured to operate in the linear mode.

The over-current sensing circuit can include a clipping bipolar transistor having a base configured to receive a clipping voltage and an emitter electrically connected to an input of the transimpedance amplifier, wherein the clipping voltage sets a level at which the clipping bipolar transistor clips the input voltage of the transimpedance amplifier. The over-current sensing circuit can include a sampling bipolar transistor having a base electrically connected to the base of the clipping bipolar transistor and a current mirror electrically connected to the sampling bipolar transistor.

An integrated circuit can include the transimpedance amplifier, the over-current sensing circuit, a first output contact electrically coupled to an output of the transimpedance amplifier, and a second output electrically coupled to an output of the over-current sensing circuit.

An integrated circuit can include the transimpedance amplifier, the over-current sensing circuit, and an output contact configured to provide a voltage indicative of the amplitude of the current pulse both in the range of current for which the transimpedance amplifier is configured to operate in the linear mode and outside the range of current for which the transimpedance amplifier is configured to operate in the linear mode.

Another aspect of this disclosure is a method of processing light in a light detection and ranging receiver with high dynamic range. The method comprises converting a pulse of light to a current pulse. The pulse of light has an optical power above a range for which a transimpedance amplifier of the light detection and ranging receiver operates in a linear region. The method also includes clipping an input voltage of the transimpedance amplifier. The method further includes generating, based on a sensed current associated with the clipping, an overload signal indicative of an amplitude of the received pulse of light having the optical power above the range for which the transimpedance amplifier operates in the linear region.

The method can include identifying an object from which the pulse of light is reflected based at least partly on the overload signal. The method further includes determining a distance between an object and a system that includes the light detection and ranging receiver based on an output signal provided by the transimpedance amplifier.

The method can further include converting a second pulse of light to a second current pulse and amplifying the second current pulse with the transimpedance amplifier, in which the second pulse of light has an optical power within the range for which the transimpedance amplifier operates in the linear region.

The method further include generating a digital signal based on the overload signal.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

The drawings and the associated description herein are provided to illustrate specific embodiments of the disclosure and are not intended to be limiting.

DETAILED DESCRIPTION

Figure 1:
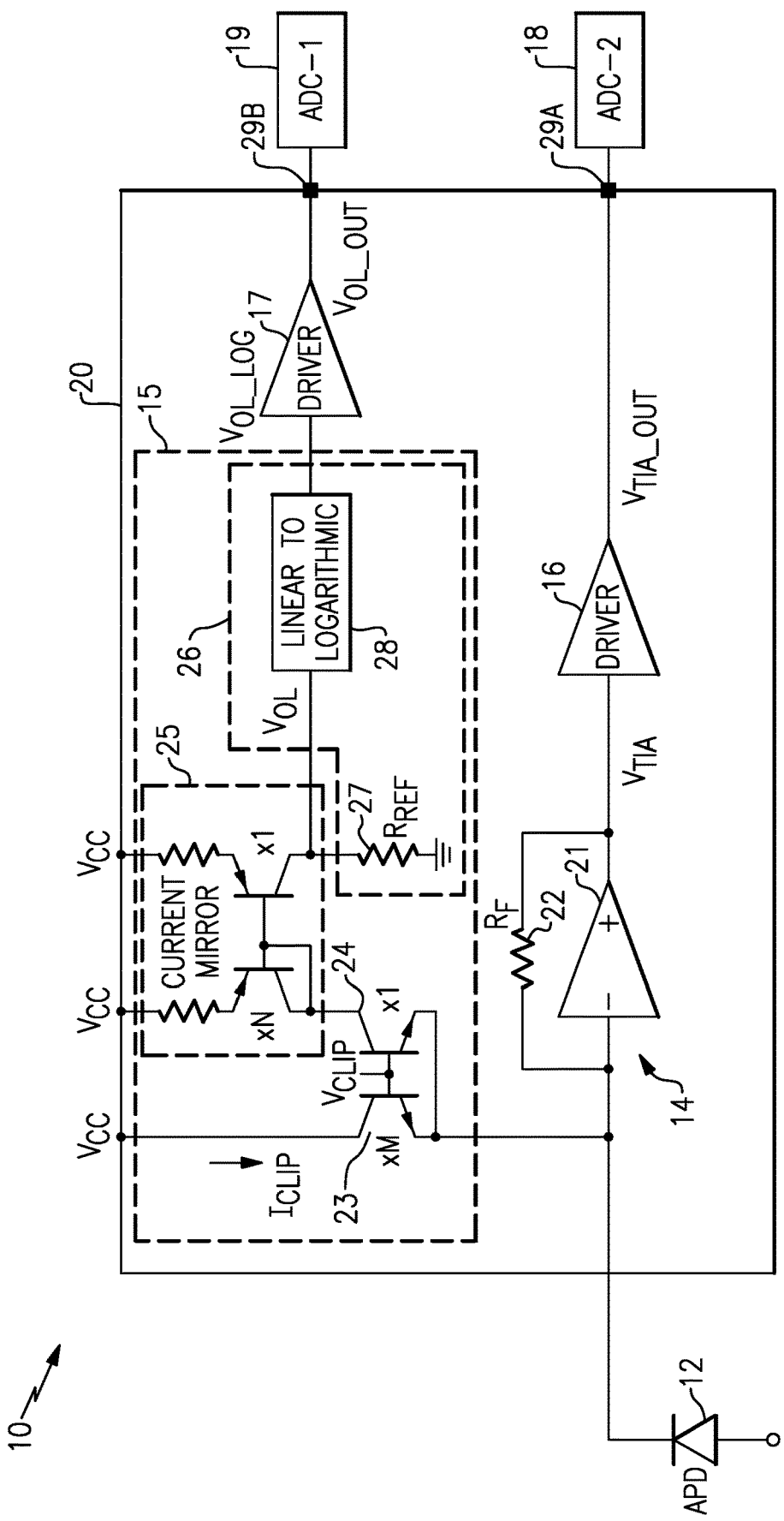
FIG. 1 is a schematic diagram of a light detection and ranging (LIDAR) receiver according to an embodiment.

The following detailed description presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A light detection and ranging system can include a transmitter and a receiver. The transmitter can generate pulses of light and transmit the pulses of light to an object. The light can be laser light. The receiver can receive and process light reflected from the object. The receiver of the light detection and ranging system can include an optoelectrical device such as an avalanche photodiode, a transimpedance amplifier (TIA), an analog-to-digital converter (ADC) driver, and an ADC. The receiver can also include a programmable gain amplifier and/or a filter such as a low pass filter.

In a variety of light detection and ranging (LIDAR) applications, a receiver front-end includes an avalanche photo diode (APD) and a TIA having an input coupled to an output of the APD. A TIA architecture in LIDAR applications is a shunt-feedback amplifier architecture. In the shunt-feedback architecture, a resistor can be coupled between an input and an output of an amplification circuit of the TIA.

The APD can generate a current pulse proportional to the received optical power. The APD can be negative biased with its cathode connected to a TIA. Accordingly, the APD can sink current from the TIA. The TIA can convert the current pulse into a voltage pulse. The TIA can provide a relatively high gain, which can facilitate detecting signals from relatively distant targets. For closer targets, the magnitude of the current pulse provided to the TIA can go beyond the linear input range of the TIA. In such cases, a shunt-feedback TIA is saturated and the shunt feedback that decreases the input impedance can be inactive. Consequently, the voltage at the TIA input can decrease to undesired levels as the input current to the TIA increases.

For relatively large input currents, the voltage at the input of the TIA can go to undesired levels. The voltage at the input of the TIA can be limited such that the TIA input transistor can operate properly and the TIA can produce meaningful outputs (e.g., the TIA operates as a limiting amplifier). The voltage at the input of the TIA can be limited such that a TIA input transistor is not damaged due to an excessive voltage difference across its terminals.

Various clipping circuits can be implemented to limit the input voltage to the TIA. For example, a diode can be used to clip the input of the TIA. A clipping voltage can be provided to a non-inverting terminal of an amplifier and an output of the amplifier can be connected to an inverting terminal of the amplifier. An anode of the diode can be connected to the output of the amplifier and a cathode of the diode can be connected to the input of the TIA. When the TIA operates in the linear region, the clipping diode can be off. When the TIA is saturated, the input voltage to the TIA decreases as the input current to the TIA increases, and the input voltage is clamped at the clipping voltage minus a diode voltage of the diode. The clipping voltage can be selected such that the TIA can properly operate in limiting mode and/or in a linear region. Another way to provide input clipping is to use a bipolar transistor. The clipping voltage can be provided to a base of the bipolar transistor and an emitter of the bipolar transistor can be electrically connected to the input of the TIA.

The APD current range can be from 10s of nanoamperes (nA) to 100s of milliamperes (mA), for example. It is typically desirable to keep the amplitude information even at relatively high current levels, such as current levels that are beyond the linear range of the TIA. The amplitude information can be useful for object identification when combined with time information, as amplitude can be dependent on the object reflectivity.

Some LIDAR TIA designs exhibit pulse widening during overload events where an input signal is beyond the linear region of the TIA. Some data about the overload current level may be extracted from the pulse widening, but this may not be reliable due to, for example, process, voltage, and temperature (PVT) variations. Also, LIDAR TIA designs have been optimized to reduce pulse widening to improve the signal integrity and provide a no-damage level for relatively large APD currents. Optimizing the design to increase pulse widening could generate undesirable trade-offs for signal integrity and no-damage levels.

Amplitude information on a received optical pulse can be lost when the input current is larger than the linear region of the TIA (e.g., in a range from about 10 nA to 100 μA). This disclosure provides technical solutions to maintain the amplitude information even in the saturated region of the TIA. The amplitude information (e.g., from the saturated region of the TIA) can be provided external to an integrated circuit (IC) that includes the TIA.

Aspects of this disclosure relate to clipping an input voltage of the TIA, sensing a clipping current associated with clipping, and generating a signal indicative of an amplitude of an input current outside of a range of power of the input current for which the TIA operates in the linear mode. This can involve sensing and scaling a clipping current and converting the scaled clipping current to an overload voltage. The overload voltage can be provided to an output contact of an IC that includes the TIA for an indication of photodiode current beyond the linear range of the TIA. In some instances, an IC that includes the TIA includes an output contact configured to provide a signal indicative of both the overload voltage and an output voltage of the TIA.

FIG. 1 is a schematic diagram of a LIDAR receiver 10 according to an embodiment. As illustrated, the LIDAR receiver 10 includes an optoelectrical device 12, a TIA 14, an over-current sensing circuit 15, a first driver 16, a second driver 17, a first analog-to-digital converter (ADC) 18, and a second ADC 19. An integrated circuit 20 includes the TIA 14, the over-current sensing circuit 15, the first driver 16, and the second driver 17. The integrated circuit 20 includes output contacts 29A and 29B configured to connect with the ADCs 18 and 19, respectively.

The optoelectrical device 12 is configured to receive a pulse of light reflected from an object and to convert the pulse of light to a current pulse. The optoelectrical device 12 can be a photodiode, such as the illustrated avalanche photodiode (APD). As illustrated in FIG. 1, the APD has its cathode connected to the TIA. Accordingly, the APD is negative biased and can sink current from the TIA 14. The illustrated optoelectrical device 12 is external to the integrated circuit 20 that includes the TIA 14 and the over-current sensing circuit 15. In some other applications, an integrated circuit can include an APD, the TIA 14, and the over-current sensing circuit 15.

The TIA 14 amplifies the current pulse from the optoelectrical device 12 and provides a voltage pulse. The illustrated TIA 14 is a shunt-feedback TIA. The illustrated TIA 14 includes an amplification circuit 21 and a feedback resistor 22 electrically coupled between an input of the TIA 14 and an output of the TIA 14. The feedback resistor 22 has a resistance $R_F$. The output of the TIA can be electrically connected to an input of an ADC driver. The first ADC driver 16 can drive the first ADC 18. The ADC 18 can convert the received pulse to a digital signal. The digital signal can be provided to a digital signal processor.

The over-current sensing circuit 15 is configured to clip an input voltage of the TIA 14, sense a clipping current Imp, and generate, an overload voltage $V_{OL}$ based on the clipping current $I_{CLIP}$. The overload voltage $V_{OL}$ is indicative of an amplitude of the light outside of the range of power of the light for which the TIA 14 operates in the linear mode. The overload voltage $V_{OL}$ is indicative of the amplitude of the light in a range of power of the light for which the TIA 14 operates in a saturation mode. As illustrated, the over-current sensing circuit 15 includes a clipping bipolar transistor 23, a sampling bipolar transistor 24, a current mirror 25, and a voltage converter 26. The illustrated voltage converter 26 includes a resistor 27 have a resistance $R_{REF}$ and a linear to logarithmic voltage conversion circuit 28. The voltage converter 26 can be referred to as a voltage conversion circuit.

Although embodiments discussed herein may be described with reference to a negative biased APD having its cathode connected to the TIA, any suitable principles and advantages discussed herein can be applied to a positive biased APD having its anode connected to the TIA. The positive biased APD can source current to the TIA. With a positive biased APD, clipping can cause the input voltage of the TIA to increase when input current is beyond the linear range of TIA. With reversed polarity, an over-current sensing circuit can be adjusted accordingly. For example, in the over-current sensing circuits of FIGS. 1, 4, and/or 5, PNP transistors can be replaced with NPN transistors and NPN transistors can be replaced with PNP transistors for a positive biased APD. For both a negative biased APD and a positive biased APD, the APD diode can be reverse biased.

In FIG. 1, the LIDAR receiver 10 includes a clipping bipolar transistor 23 arranged to route extra current from the APD during a clipping event. The clipping event can also be referred to as an overload event. The extra current can be additional APD current after TIA 14 is saturated. The extra current can be referred to as a clipping current $I_{CUP}$. For a TIA 14 with a 100 microamperes (μA) linear region, the clipping current $I_{CUP}$ can be equal to about the current $I_{APD}$ from the APD minus 100 μA. A bipolar transistor can be beneficial for clipping due to an exponential characteristic. The clipping bipolar transistor 23 can be a relatively small device and clip a relatively large current.

A sampling bipolar transistor 24 can be used to sample a portion of the clipping current $I_{CLIP}$, such as $I_{CLIP}/M$ in which M is greater than 1. The clipping current $I_{CLIP}$ can be further scaled using a current mirror to provide a scaled clipping current. In FIG. 1, the scaled clipping current is $I_{CLIP}/(M*N)$. N can be greater than 1. Accordingly, the current mirror 25 can scale down current from the sampling bipolar transistor 24. In some other applications, N can be smaller than 1 such that the current mirror 25 amplifies instead of attenuates current.

The scaled clipping current can be converted to a voltage using the resistor 27 of the voltage converter 26 to generate an overload voltage $V_{OL}$. The overload voltage $V_{OL}$ can be provided to an ADC driver 17 to drive the second ADC 19. In some instances, a linear to logarithmic voltage converter 28 can be in a signal path between the resistor 27 and the ADC driver 17 as illustrated in FIG. 1. The TIA output can be coupled to the first ADC driver 16 to drive the first ADC 18 as illustrated.

The TIA output voltage $V_{TIA\_OUT}$ provided by the first driver 16 can provide information on the optical amplitude range for optical powers that are in the linear range of the optoelectrical device 12 and the TIA 14. The overload output voltage $V_{OL\_OUT}$ provided by the second driver 17 can provide information on the optical amplitude range for optical powers that are higher than a saturation range of the TIA 14. The amplitude information can be used to identify an object from which the light received by the optoelectrical device 12 was reflected. A digital signal processor can identify the object. The digital signal processor can also determine a distance between the object and the LIDAR system.

The over-current sensing circuit 15 and the TIA 14 of FIG. 1 together implement a high dynamic range TIA. The high dynamic range TIA provides amplitude information on an optical signal received by the optoelectrical device 12 for optical power within and above the linear range of the TIA 14.

An integrated circuit 20 can include the over-current sensing circuit 15 and the TIA 14. In FIG. 1, the integrated circuit 20 includes the illustrated elements except for the optoelectrical device 12 and the ADCs 18 and 19. The integrated circuit 20 outputs the overload output voltage $V_{OL\_OUT}$ in FIG. 1. Any other suitable voltage can alternatively or additionally be output from an integrated circuit, such as an overload voltage $V_{OL}$ and/or a logarithmic overload voltage $V_{OL\_LOG}$. In some embodiments, an integrated circuit can output an overload current from the sampling transistor 24 or from the current mirror 25. The overload current can be converted to a voltage external to the integrated circuit. Alternatively or additionally, the overload current can be converted to a digital signal using a current mode ADC.

Any transistors illustrated as bipolar transistors in the over-current sensing circuit 15 can be implemented by field effect transistors as suitable.

Figure 2A:
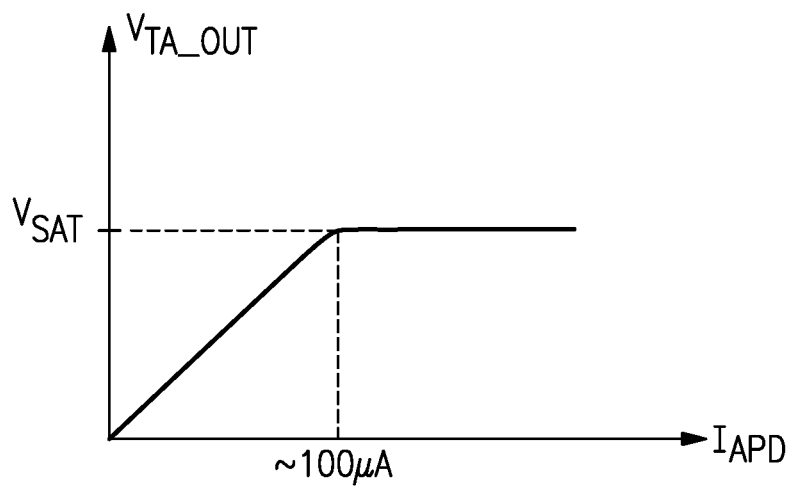
FIG. 2A is a graph of transimpedance amplifier (TIA) output voltage versus output current of an avalanche photodiode for the LIDAR receiver of FIG. 1.

FIG. 2A is a graph of the TIA output voltage $V_{TIA\_OuT}$ versus output current $I_{APD}$ of the APD for the receiver 10 of FIG. 1. The TIA output voltage $V_{TIA\_OuT}$ provides information on the optical amplitude range for optical powers that are in the linear range of the optoelectrical device 12 and TIA 14. The linear range is up to 100 μA in this example. As illustrated in FIG. 1, the TIA output voltage $V_{TIA\_OuT}$ can be provided by the first driver 16 in the receiver 10.

Figure 2B:
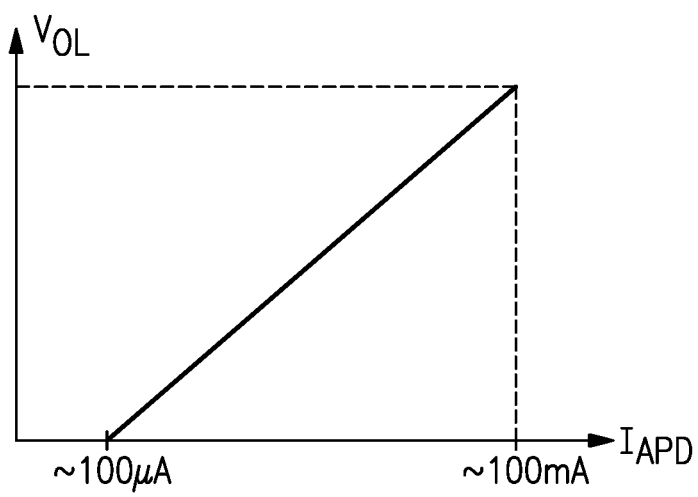
FIG. 2B is a graph of an overload output voltage versus output current of the avalanche photodiode for the LIDAR receiver of FIG. 1.

FIG. 2B is a graph of the overload output voltage $V_{OL\_OUT}$ versus output current $I_{APD}$ of the APD of the receiver 10 of FIG. 1. The overload output voltage $V_{OL\_OUT}$ provides information on the optical amplitude range for optical powers that are higher than saturation range of the TIA 14. In this example, overload output voltage $V_{OL\_OUT}$ provides amplitude information for the APD current $I_{APD}$ from approximately 100 μA and 100 mA. If the output conversion from $I_{ADP}$=100 μA to the overload output voltage $V_{OL\_OUT}$ is linear, it could be difficult to use the overload output voltage $V_{OL\_OUT}$ for a dynamic range of 100 μA to 100 mA (60db). For example, if the APD current $I_{APD}$ to the overload voltage $V_{OL}$ gain is 10 Ohms, $I_{ADP}$=200 μA should correspond to $V_{oL}$=1 mV while $I_{APD}$=100 mA should correspond to $V_{oL}$=1V. A linear to logarithmic voltage converter 28 can be included in a signal path between the resistor 27 and the ADC 19, for example, as shown in FIG. 1.

In certain embodiments, a linear-to-logarithmic converter can be used for logarithmic compression of the APD current $I_{APD}$ range when converting to a logarithmic overload voltage $V_{OL\_LOG}$. The ADC 19 can provide more resolution at a lower end of the dynamic range with the logarithmic overload voltage $V_{OL\_LOG}$ relative to a linear overload voltage, such as the overload voltage $V_{OL}$ of FIG. 1.

Figure 2C:
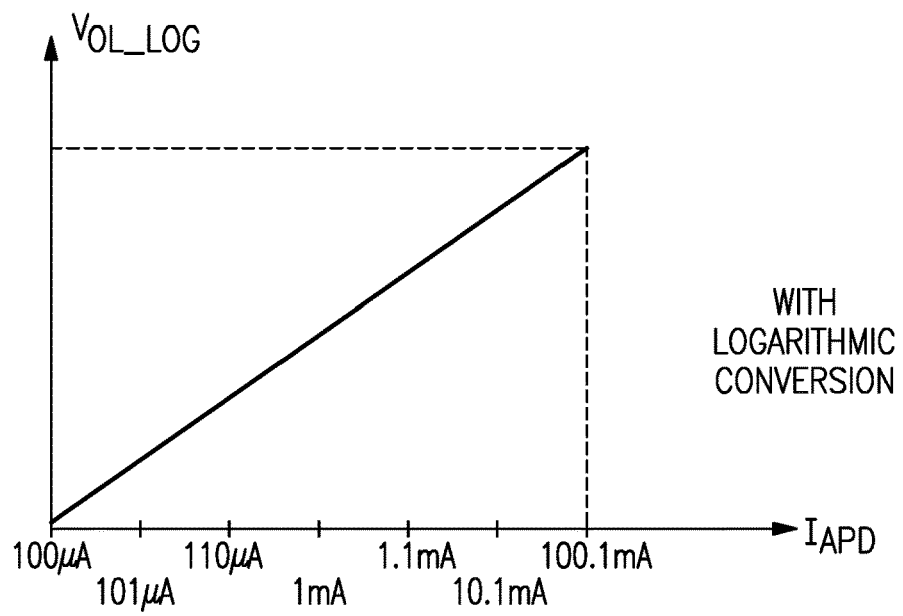
FIG. 2C is a graph of a logarithmic overload voltage versus output current of the avalanche photodiode for the LIDAR receiver of FIG. 1.

FIG. 2C is a graph of the logarithmic overload voltage $V_{OL\_LOG}$ versus output current of an APD $I_{APD}$. For example, with a logarithmic slope of 200 mV/decade, $-12$-$I_{ADP}$=101 μA corresponds to $V_{OL\_LOG}$=200mV, $I_{APD}$=110 μA corresponds to $V_{OL\_LOG}$=400mV, $I_{APD}$=200 μA corresponds to $V_{OL\_LOG}$=600mV, $I_{ADP}$=1.1mA corresponds to $V_{OL\_LOG}$=800mV, $I_{ADP=10.1}$ mA corresponds to $V_{OL\_LOG}$=1V, and $I_{ADP=100.1}$ mA corresponds to $V_{OL\_LOG}$=1.2V.

Figure 3:
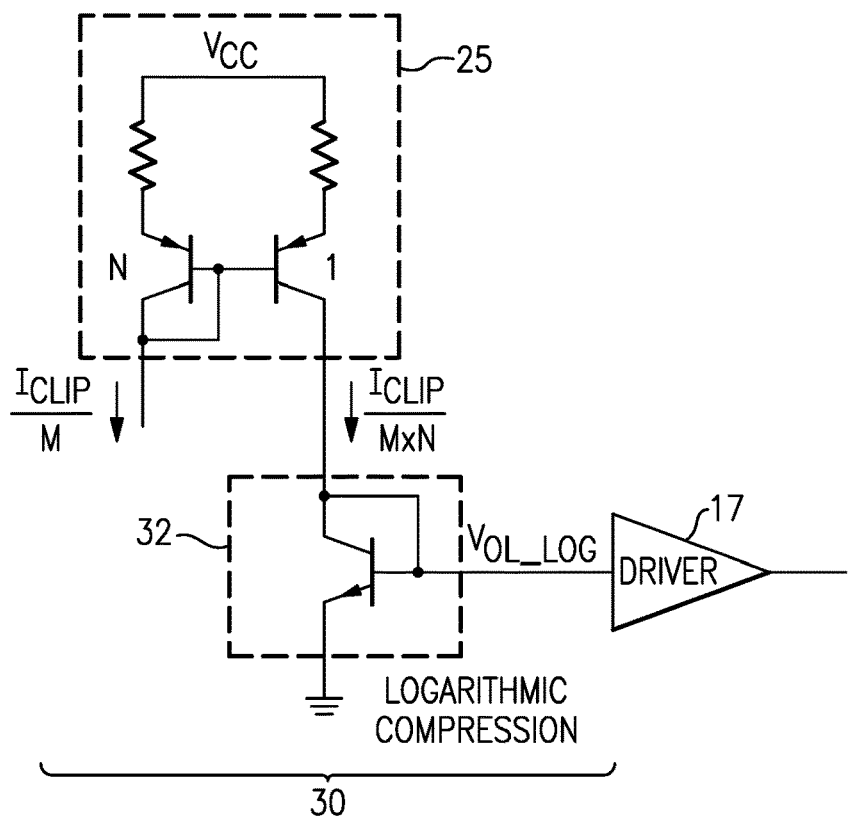
FIG. 3 is a schematic diagram that illustrates that a bipolar transistor can be used for linear to logarithmic conversion in an over-current sensing circuit according to an embodiment.

FIG. 3 is a schematic diagram that illustrates that a bipolar transistor 32 can be used for linear to logarithmic conversion. FIG. 3 illustrates a portion of an over-current sensing circuit 30 and an ADC driver 17. The bipolar transistor 32 can be diode connected. A diode connected bipolar transistor (e.g., as shown in FIG. 3) can be implemented in place of the resistor 27 and the linear to logarithmic voltage converter 28 in the over-current sensing circuit 15 of FIG. 1. According to some other embodiments, more complex circuits, such as root mean square (RMS) power detector circuits, can be used for linear to logarithmic voltage conversion.

In FIG. 1, an integrated circuit 20 that includes the TIA 14 also includes separate output contacts 29B and 29A for the overload output voltage $V_{OL\_OUT}$ and the TIA output voltage $V_{TIA\_OUT}$, respectively. As an alternative to using two different output contacts to cover linear and saturated ranges of the TIA 14, output signals from the TIA 14 and the over-current sensing circuit 15 can be combined. The combined output can be provided to a single output contact of an integrated circuit. The combined output can be provided to a single ADC.

Figure 4:
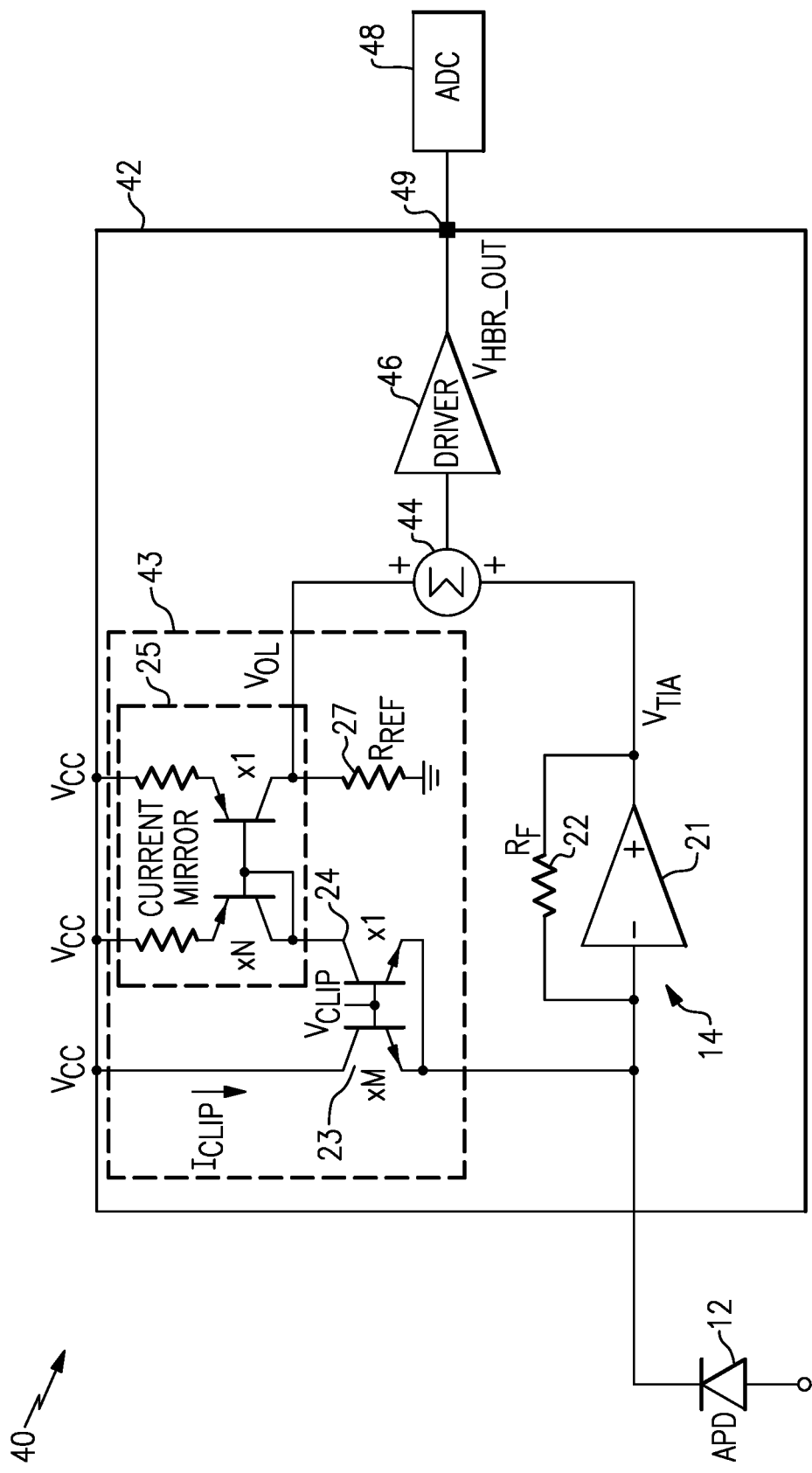
FIG. 4 is a schematic diagram of a receiver in which a TIA output voltage is combined with an overload voltage according to an embodiment.
Figure 5:
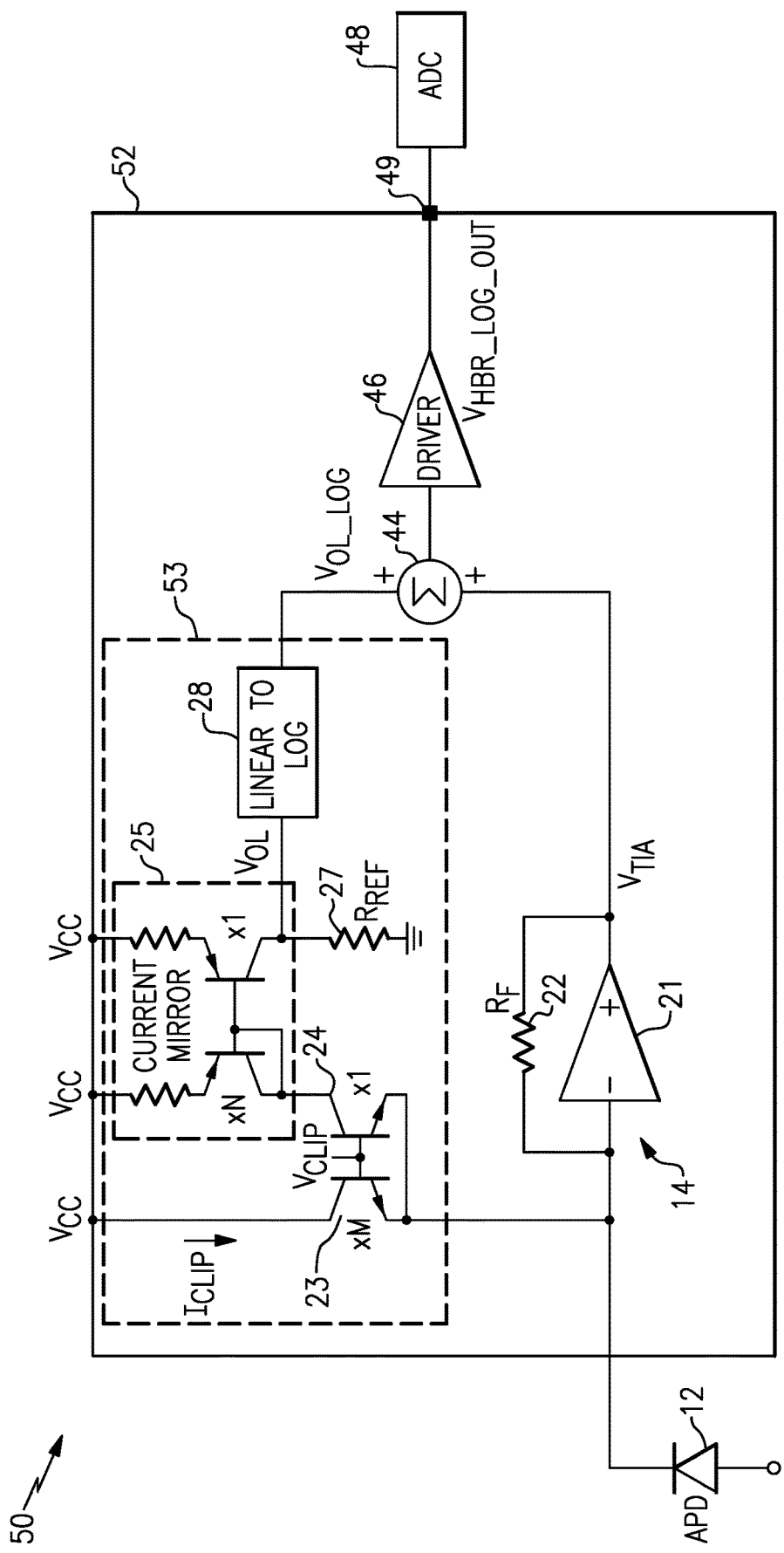
FIG. 5 is a schematic diagram of a receiver in which a TIA output voltage is combined with a logarithmic overload voltage according to an embodiment.

FIGS. 4 and 5 illustrate embodiments in which a TIA output voltage is combined with a voltage representative of an amplitude of a current pulse from the APD outside of the linear range of the TIA. These voltages can be combined to generate a high dynamic range output voltage $V_{HDR\_OUT}$ for a linear TIA voltage $V_{TIA}$ and overload voltage $V_{OL}$ combination, for example, as shown in FIG. 4. Alternatively, the voltages can be combined to generate a high dynamic range logarithmic output voltage $V_{HDR\_OUT\_LOG}$ for a linear TIA voltage $V_{TIA}$ and logarithmic overload voltage $V_{OL\_LOG}$ combination, for example, as shown in FIG. 5. The TIA output voltage and the voltage representative of the amplitude of the current pulse from the APD outside of the linear range of the TIA can be phase aligned prior to combining these voltages.

FIG. 4 is a schematic diagram of a LIDAR receiver 40 according to an embodiment. As illustrated, the LIDAR receiver 40 includes an optoelectrical device 12, a TIA 14, an over-current sensing circuit 43, a combining circuit 44, a driver 45, and an ADC 48. An integrated circuit 42 includes the TIA 14, the over-current sensing circuit 43, the combining circuit 44, and the driver 45. The integrated circuit 42 includes an output contact 49. The output contact 49 can provide an output signal indicative of the amplitude of a current pulse generated by the optoelectrical device 12 both in the range of current for which the TIA 14 is configured to operate in the linear mode and outside the range of current for which the TIA 14 is configured to operate in the linear mode. In FIG. 4, the output signal is the high dynamic range output voltage $V_{HDR\_OUT}$.

The over-current sensing circuit 43 is configured to generate an overload voltage $V_{OL}$. The combing circuit 44 can combine the overload voltage $V_{OL}$ with an output voltage $V_{TIA}$ from the TIA 14. The combining circuit 44 can add these voltage signals. In some other implementations, the combining circuit 44 can perform any other suitable operation to combine signals from the TIA 14 and the overcurrent sensing circuit 43. The driver 46 can drive a signal from the combing circuit 44 to the ADC 48. As illustrated, the output contact 49 of the integrated circuit 42 is in a signal path from the combining circuit 44 and the ADC 48.

FIG. 5 is a schematic diagram of a LIDAR receiver 50 according to an embodiment. The LIDAR receiver 50 is like the LIDAR receiver 40 of FIG. 4 except that a linear to logarithmic voltage converter 28 is additionally included on the LIDAR receiver 50.

The integrated circuit 52 of the LIDAR receiver 50 is like the integrated circuit 42 of FIG. 4, except that the integrated circuit 52 includes a current-sensing circuit 53 that includes the linear to logarithmic voltage converter 28. In FIG. 5, the linear to logarithmic voltage converter 28 is coupled between the current mirror 25 and the combining circuit 44.

The LIDAR receiver 50 is configured to provide a high dynamic range logarithmic output voltage $V_{HDR\_OUT\_LOG}$ for a linear TIA voltage $V_{TIA}$ and logarithmic overload voltage $V_{OL\_LOG}$ combination. The high dynamic range logarithmic output voltage $V_{HDR\_OUT\_LOG}$ is provided to output contact 49 of an integrated circuit 52.

Figure 6:
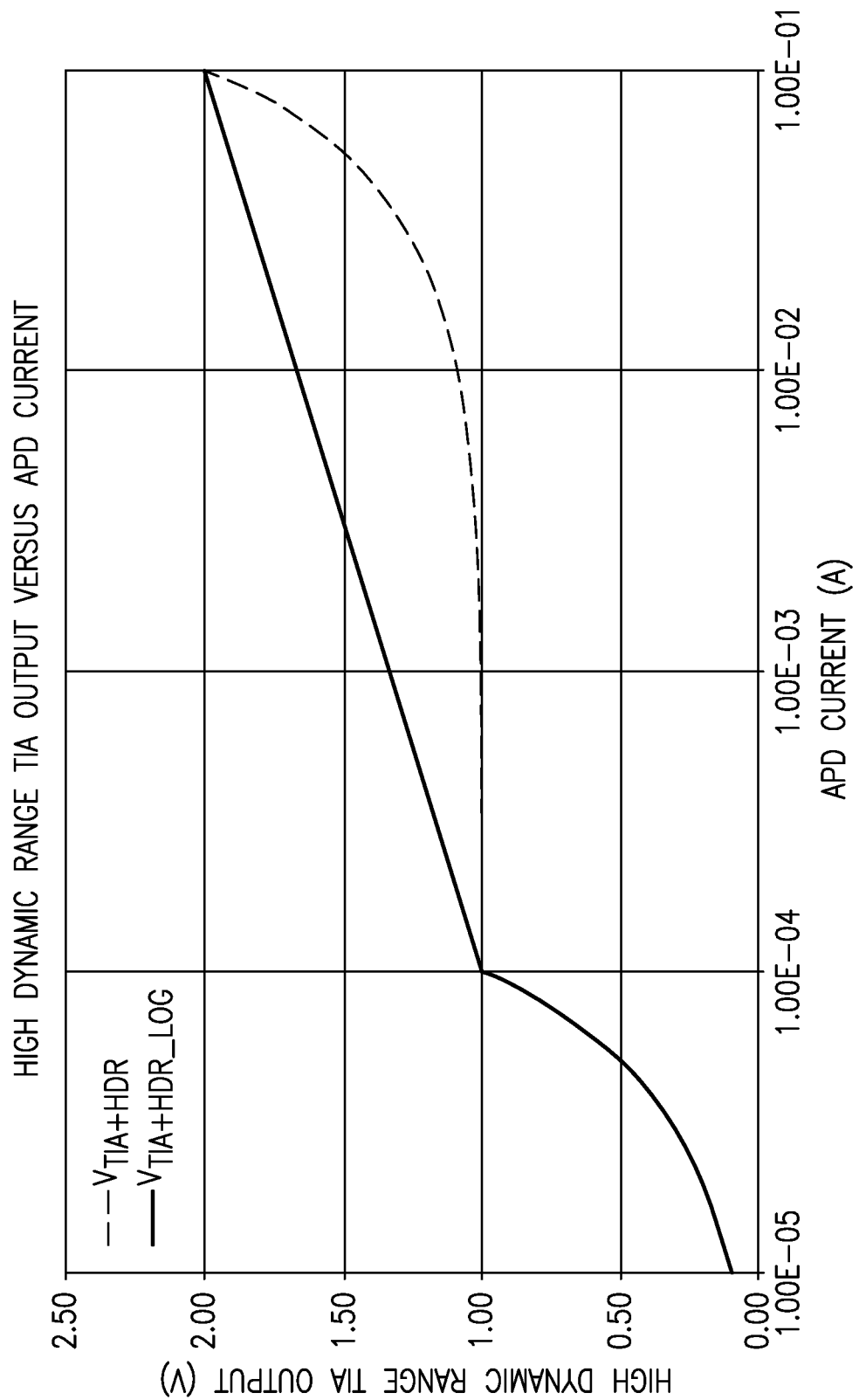
FIG. 6 illustrates example plots for a high dynamic range output voltage corresponding to the receiver of FIG. 4 and a high dynamic range logarithmic output voltage corresponding to FIG. 5.

FIG. 6 illustrates example plots for the high dynamic range output voltage $V_{HDR\_OUT}$ for the receiver 40 of FIG. 4 and the high dynamic range logarithmic output voltage $V_{HDR\_LOG\_OUT}$ for the receiver 50 of FIG. 5. FIG. 6 shows the difference between the high dynamic range output voltage $V_{HDR\_OUT}$ and the high dynamic range logarithmic output voltage $V_{HDR\_LOG\_OUT}$ corresponding to the saturation region of the TIA 14.

Figure 7:
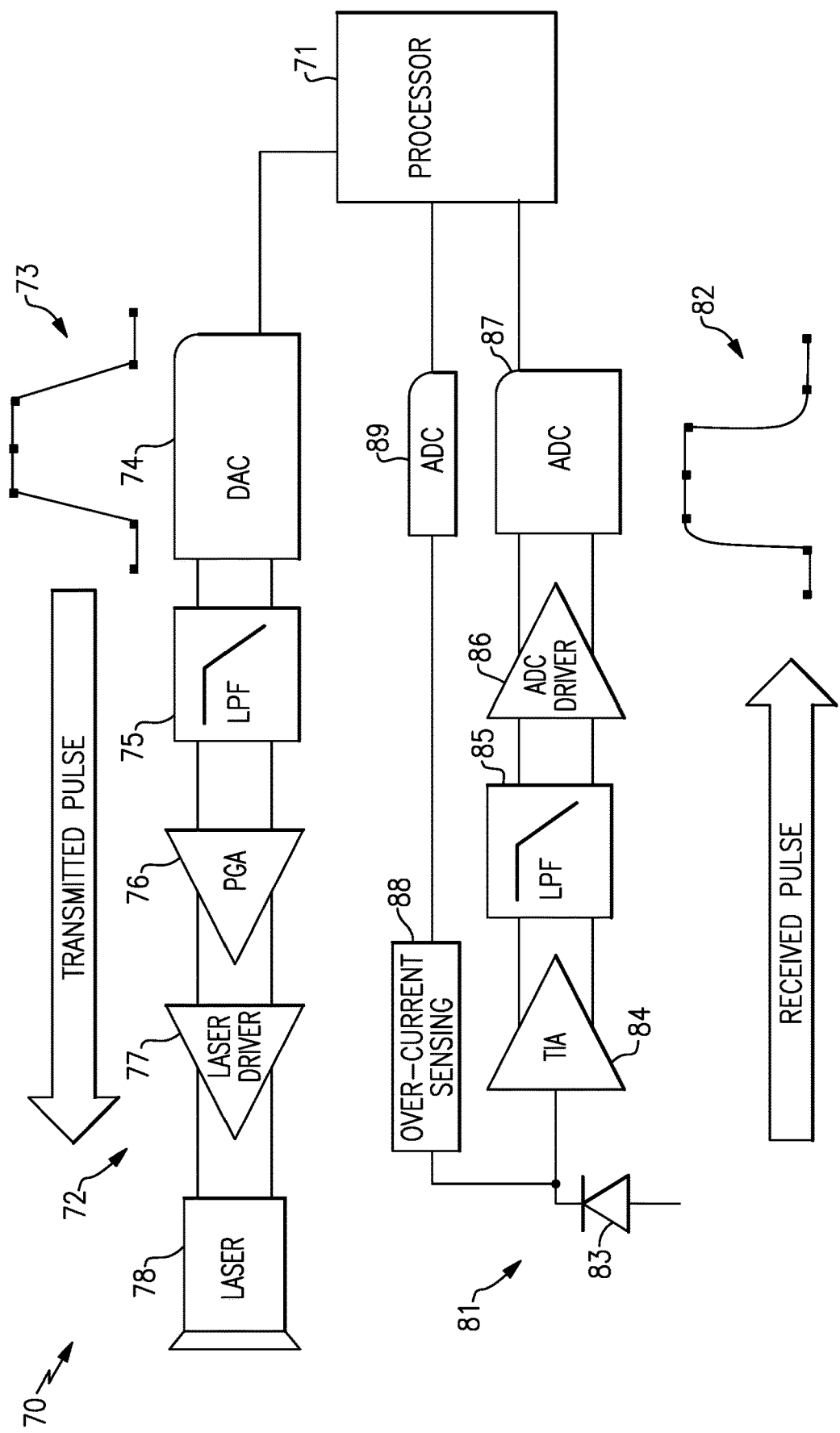
FIG. 7 is a block diagram of an example laser range finding system according to an embodiment.

FIG. 7 is a block diagram of an example laser range finding system 70 that includes a processor 71, a transmitter signal chain 72, and receiver signal chain 81. The laser range finding system 70 is an example system that can include LIDAR receivers discussed herein. The receiver signal chain 81 can have high dynamic range in accordance with any suitable principles and advantages discussed herein. In some instances, a receiver of a laser range finding system can be implemented separately from a transmitter. The illustrated transmitter signal chain 72 includes a digital-to-analog converter (DAC) 74, a low pass filter (LPF) 75, a programmable gain amplifier (PGA) 76, a laser driver 77, and a laser 78. The illustrated receiver chain 81 includes a photodiode (PD) 83, a TIA 84, a LPF 85, an ADC driver 86, a first ADC 87, an over-current sensing circuit 88, and a second ADC 89. In some instances, a receiver chain can include a PGA coupled between the TIA 84 and the LPF 85. Such a PGA could be implemented in place of or in addition to the ADC driver 87.

The illustrated transmitter chain 72 includes a laser 78 driven by the laser driver 77 to emit laser light corresponding to a pulse 73. While FIG. 7 relates to a laser range finding system that includes the laser 78, any suitable principles and advantages discussed herein can be implemented with a light range finding system that includes any suitable light source. In some embodiments, the pulse 73 can be generated by the processor 71 and can propagate from the DAC 74 through the LPF 75 and the PGA 76 to the laser driver 77 to drive the laser 78.

The emitted light can reach an object or a target and reflected light can be received by the PD 83 of the receiver chain 81. The reflected light can be detected at the PD 73. The PD 83 can be an avalanche photodiode, for example. The PD 83 can generate a received pulse 82 based on the received reflected light and the received pulse 82 can be processed by the TIA 84 and the LPF 85. The LPF 85 can be a tunable filter in certain embodiments. As illustrated, the LPF 85 is coupled in a signal path between the TIA 84 and the ADC driver 86. In some other implementations, an LPF can be coupled in a signal path between the ADC driver 86 and the ADC 87. The ADC driver 86 can drive the first ADC 87. The first ADC 87 can convert the received pulse to a digital signal.

The over-current sensing circuit 88 can be implemented in accordance with any suitable principles and advantages of the over-current sensing circuits discussed herein. The over-current sensing circuit 88 can clip an input of the TIA 84 and generate an overload signal indicative of an amplitude of the reflected light received by the PD 83 outside of the range of current for which the TIA 84 is operable in a linear mode. The second ADC can convert the overload signal to a digital overload signal.

The processor 71 can be a baseband digital signal processor. The processor 71 can determine a distance between an object and the laser range finding system 70. The processor 71 can output a signal indicative of the distance. The processor 71 can identify an object from which the pulse of light reflected from the PD 83 based at least partly on the overload signal. The processor 71 can output data identifying the object.

Figure 8:
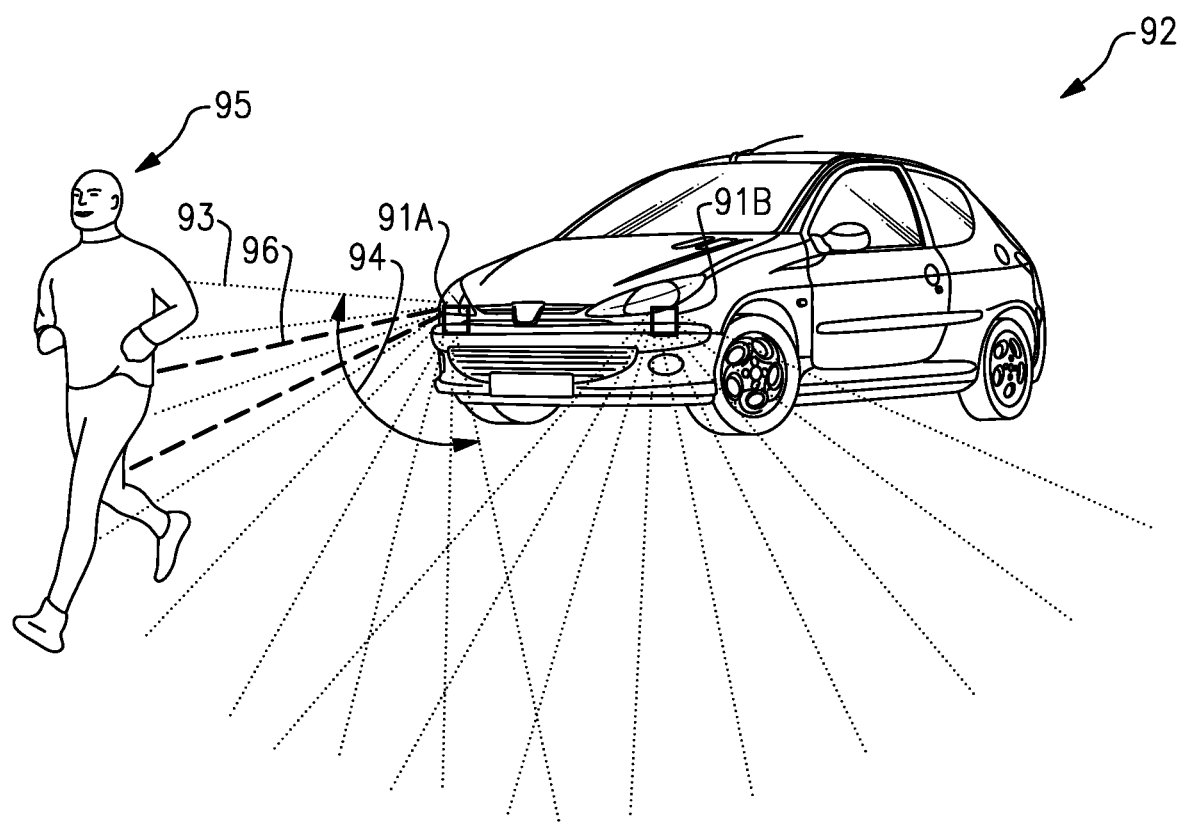
FIG. 8 shows a LIDAR system integrated with an automobile.

FIG. 8 shows a LIDAR system integrated with an automobile 92. This illustrates an example application in which LIDAR receivers discussed herein can be implemented. FIG. 8 illustrates two LIDAR systems 91A and 92B integrated with the automobile 92. A first LIDAR system 91A is positioned near a right headlight of the automobile 92 and the second LIDAR system 92B is positioned near the left headlight of automobile 92. The LIDAR systems 91A and/or 92B can implement any suitable principles of the LIDAR receivers discussed herein. The LIDAR systems 91A and/or 92B can detect a distance between the automobile 92 and the object 95.

As illustrated, a transmitter of the LIDAR system 91A can transmit pulses of light 93 at an angle 94. The transmitted light 93 can travel through the air and reach an object 95. The object 95 can reflect back pulses of light 96 to a receiver of the LIDAR system 91A. Embodiments discussed herein can generate information to identify the object 95. The pulses of light 93 can be transmitted three dimensionally to obtain three dimensional information of the surroundings.

One or more additional LIDAR systems can be integrated with the automobile 92 to cover a wider range of area for detection and/or to obtain additional information regarding a selected area. In some embodiments, data collected by each LIDAR system can be combined to analyze information from a wider range of area and/or to provide additional information about a selected area. In some embodiments, the angle 94 can be adjusted and the angle 94 can be in any suitable range.

Any of the principles and advantages discussed herein can be applied to other systems, devices, integrated circuits, electronic apparatus, methods, not just to the embodiments described above. The elements and operations of the various embodiments described above can be combined to provide further embodiments. The principles and advantages of the embodiments can be used in connection with any other systems, devices, integrated circuits, apparatus, or methods that could benefit from any of the teachings herein.

Aspects of this disclosure can be implemented in various range finding systems. For instance, aspects of this disclosure can be implemented in any suitable LIDAR system such as, for example, automotive LIDAR, industrial LIDAR, space LIDAR, military LIDAR, etc. LIDAR systems can include a receiver or a transmitter and a receiver. LIDAR systems can be integrated with a vehicle, such as an automobile, a drone such as an unmanned flying machine, an autonomous robot, or a space vehicle. LIDAR systems can transmit and/o receive laser light. LIDAR systems can be used for three-dimensional sensing applications. LIDAR systems can be used with augmented reality technology. Moreover, aspects of this disclosure can be implemented in various electronic devices. Examples of the electronic devices can include, but are not limited to, electronic products, parts of electronic products such as integrated circuits, vehicular electronics such as automotive electronics, etc. Further, the electronic devices can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The word "coupled," as generally used herein, refers to two or more elements that may be either directly coupled to each other, or coupled by way of one or more intermediate elements. Likewise, the word "connected," as generally used herein, refers to two or more elements that may be either directly connected, or connected by way of one or more intermediate elements. Additionally, the words "herein," "above," and words of similar import, when used in this application, shall refer to this application as a whole and not to any particular portions of this application. Where the context permits, words in the above Detailed Description using the singular or plural number may also include the plural or singular number respectively. Where the context permits, the word "or" in reference to a list of two or more items is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example, and are not intended to limit the scope of the disclosure. Indeed, the novel methods, apparatus, and systems described herein may be embodied in a variety of other forms. Furthermore, various omissions, substitutions and changes in the form of the methods, apparatus, and systems described herein may be made without departing from the spirit of the disclosure. For example, circuit blocks and/or circuit elements described herein may be deleted, moved, added, subdivided, combined, and/or modified. Each of these circuit blocks and/or circuit elements may be implemented in a variety of different ways. The accompanying claims and their equivalents are intended to cover any such forms or modifications as would fall within the scope and spirit of the disclosure.

What is claimed is:

1. A receiver for a light detection and ranging system with high dynamic range, the receiver comprising:
   an optoelectrical device configured to receive light and to convert the light to a current;
   a transimpedance amplifier configured to generate an output voltage from the current, the transimpedance amplifier being operable in a linear mode for a range of power of the light; and
   an over-current sensing circuit coupled to the transimpedance amplifier, the over-current sensing circuit configured to generate an overload signal indicative of an amplitude of the light outside of the range of power of the light for which the transimpedance amplifier is operable in the linear mode.

2. The receiver of claim 1, wherein the over-current sensing circuit is configured to clip an input voltage of the transimpedance amplifier, sense a clipping current associated with clipping the input voltage to the transimpedance amplifier, and generate the overload signal based on the clipping current.

3. The receiver of claim 2, wherein the overload signal is an overload voltage, and the over-current sensing circuit comprises a voltage conversion circuit configured to generate the overload voltage based on the clipping current.

4. The receiver of claim 1, wherein the over-current sensing circuit comprises:
   a clipping circuit configured to clip an input voltage of the transimpedance amplifier and provide a clipping current; and
   a current scaling circuit configured to scale the clipping current to generate a scaled clipping current, wherein the over-current sensing circuit is configured to generate the overload signal based on the scaled clipping current.

5. The receiver of claim 1, wherein the over-current sensing circuit comprises a clipping bipolar transistor having a base configured to receive a clipping voltage and an emitter electrically connected to an input of the transimpedance amplifier, wherein the clipping voltage sets a level at which the clipping bipolar transistor clips the input voltage of the transimpedance amplifier.

6. The receiver of claim 1, further comprising a combining circuit configured to combine the output voltage generated by the transimpedance amplifier and overload signal, wherein the overload signal is an overload voltage.

7. A current pulse processing circuit with high dynamic range, the current pulse processing circuit comprising:
   a transimpedance amplifier configured to generate a voltage pulse from a current pulse, the transimpedance amplifier operable in a linear mode for a range of current; and an over-current sensing circuit coupled to the transimpedance amplifier, the over-current sensing circuit configured to generate an overload signal indicative of an amplitude of the current pulse outside of the range of current for which the transimpedance amplifier is operable in the linear mode.

8. The current pulse processing circuit of claim 7, wherein the over-current sensing circuit is configured to sense a clipping current associated with clipping an input voltage to the transimpedance amplifier and to generate the overload signal based on the clipping current.

9. The current pulse processing circuit of claim 7, wherein the over-current sensing circuit comprises:
   a clipping circuit configured to clip an input voltage of the transimpedance amplifier and provide a clipping current; and
   a voltage conversion circuit configured to generate the overload signal based on the clipping current, wherein the overload signal is a voltage signal.

10. The current pulse processing circuit of claim 9, wherein the over-current sensing circuit comprises a current scaling circuit configured to scale the clipping current to generate a scaled clipping current, wherein the overload signal is based on the scaled clipping current.

11. The current pulse processing circuit of claim 9, wherein the voltage conversion circuit is configured such that the overload signal has a logarithmic relationship with the amplitude of the current pulse out of the range of current for which the transimpedance amplifier is configured to operate in the linear mode.

12. The current pulse processing circuit of claim 9, wherein the voltage conversion circuit is configured such that the overload signal has a linear relationship with the amplitude of the current pulse out of the range of current for which the transimpedance amplifier is configured to operate in the linear mode.

13. The current pulse processing circuit of claim 7, wherein the over-current sensing circuit comprises a clipping bipolar transistor having a base configured to receive a clipping voltage and an emitter electrically connected to an input of the transimpedance amplifier, wherein the clipping voltage sets a level at which the clipping bipolar transistor clips the input voltage of the transimpedance amplifier.

14. The current pulse processing circuit of claim 13, wherein the over-current sensing circuit comprises:
   a sampling bipolar transistor having a base electrically connected to the base of the clipping bipolar transistor; and
   a current mirror electrically connected to the sampling bipolar transistor.

15. The current pulse processing circuit of claim 7, wherein an integrated circuit comprises the transimpedance amplifier, the over-current sensing circuit, a first output contact electrically coupled to an output of the transimpedance amplifier, and a second output electrically coupled to an output of the over-current sensing circuit.

16. The current pulse processing circuit of claim 7, wherein an integrated circuit comprises the transimpedance amplifier, the over-current sensing circuit, and an output contact configured to provide a voltage indicative of the amplitude of the current pulse both in the range of current for which the transimpedance amplifier is configured to operate in the linear mode and outside the range of current for which the transimpedance amplifier is configured to operate in the linear mode.

17. A method of processing a pulse of light in a light detection and ranging receiver with high dynamic range, the method comprising:
   converting the pulse of light to a current pulse, the pulse of light having an optical power above a range for which a transimpedance amplifier of the light detection and ranging receiver operates in a linear region;
   clipping an input voltage of the transimpedance amplifier; and
   generating, based on a sensed current associated with the clipping, an overload signal indicative of an amplitude of the received pulse of light having the optical power above the range for which the transimpedance amplifier operates in the linear region.

18. The method of claim 17, further comprising identifying an object from which the pulse of light reflected based at least partly on the overload signal.

19. The method of claim 18, further comprising determining a distance between an object and the light detection and ranging receiver based on an output signal provided by the transimpedance amplifier.

20. The method of claim 17, further comprising:
   converting a second pulse of light to a second current pulse, the second pulse of light having an optical power within the range for which the transimpedance amplifier operates in the linear region; and
   amplifying the second current pulse with the transimpedance amplifier.

* * * * *